United States Patent [19]

Streit et al.

[11] 4,150,305
[45] Apr. 17, 1979

[54] FREQUENCY DIVIDER CIRCUITS

[75] Inventors: Klaus Streit, Tübingen; Hartmut Seiler, Reutlingen; Klaus Jaeckel, Eningen; Ulrich Drews, Vaihingen-Pulverdingen; Peter Werner, Stuttgart; Erwin Gloss, Korntal-Münchingen, all of Fed. Rep. of Germany

[73] Assignee: Robert Bosch GmbH, Stuttgart, Fed. Rep. of Germany

[21] Appl. No.: 822,451

[22] Filed: Aug. 5, 1977

[30] Foreign Application Priority Data

Aug. 12, 1976 [DE] Fed. Rep. of Germany ....... 2636344

[51] Int. Cl.² .............................................. H03K 21/00
[52] U.S. Cl. ................................. 307/225 R; 307/215; 307/247 R; 328/42
[58] Field of Search ........... 307/225 R, 220 R, 226 R, 307/215, 247 R; 328/39, 41, 42

[56] References Cited
U.S. PATENT DOCUMENTS

| 3,351,778 | 11/1967 | Seelbach et al. | 307/226 X |
| 3,473,129 | 10/1969 | Tschannen | 328/39 X |
| 3,663,743 | 5/1972 | Dann | 328/39 X |
| 3,970,867 | 7/1976 | Leuschner | 307/225 R |

Primary Examiner—John S. Heyman
Attorney, Agent, or Firm—Edwin E. Greigg

[57] ABSTRACT

A frequency divider circuit and variants thereof, intended for use with the fuel injection system of an internal combustion engine. The primary trigger signal is one derived from a rotating engine member and this signal is used to generate two input pulse trains of opposite relative phase. A basic dividing block includes two bistable multivibrators formed by gates with crossed feedback. The inputs to these multivibrators are provided by two-input gates and the input pulse trains are applied, respectively, to the input gates ahead of the first and second multivibrators. The second inputs of the input gates receive the direct or crossed-over outputs of the multivibrators. Additional circuitry is disclosed for providing odd dividing ratios, e.g. 1:3.

14 Claims, 7 Drawing Figures

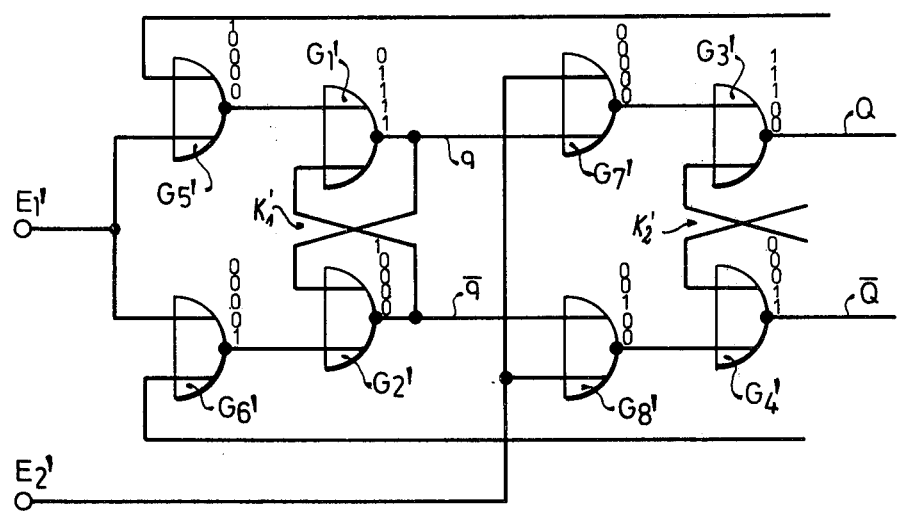
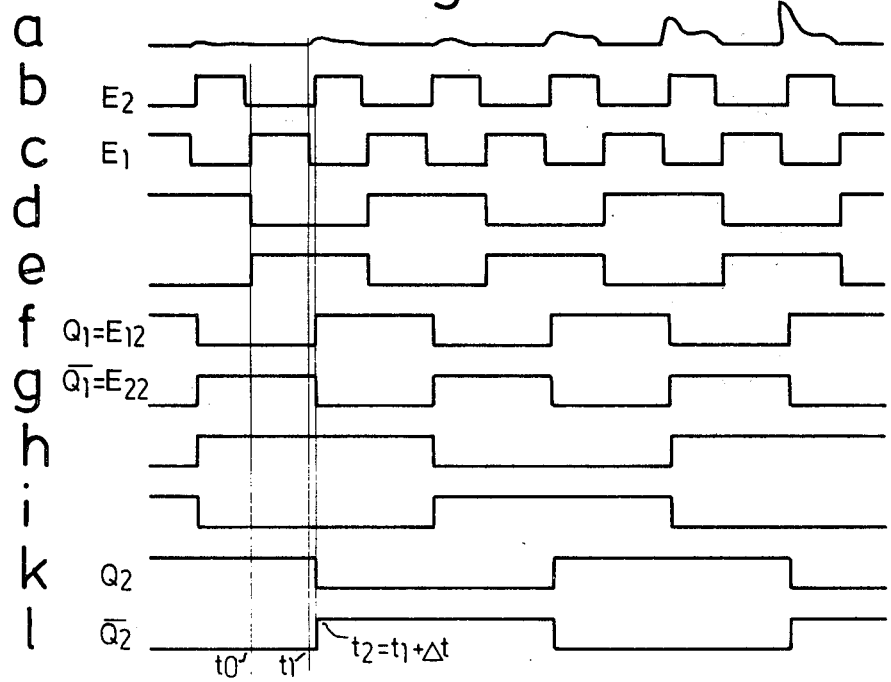

FREQUENCY DIVIDER CIRCUITS

BACKGROUND OF THE INVENTION

The invention relates to an asynchronous frequency divider circuit for use especially with a fuel injection system of an internal combustion engine. When so used, the divider circuit generates a control pulse train for the actuation of fuel injection values on the basis of an input pulse train synchronous with or related to a rotating engine member, for example the crankshaft or the ignition distributor.

Known in the art is the use of bistable multivibrators for frequency division of pulse trains, in even or uneven ratios, and synchronously actuated by a common clock pulse train. Also known are frequency divider circuits containing bistable multivibrators which are actuated dynamically, i.e., via capacitors in the input circuits of the dividing sub-circuits.

OBJECT AND SUMMARY OF THE INVENTION

It is a principal object of the invention to provide an asynchronous frequency divider circuit. It is a further object of the invention to provide an asynchronous frequency divider circuit which is relatively simple and immune to disturbances and which does not employ capacitors. Yet another object of the invention is to provide an asynchronous frequency divider circuit which is amenable to integration without great expense, which has a relatively small number of external connections and which is capable of an uneven dividing ratio.

These and other objects are attained according to the invention by providing a frequency divider circuit including bistable multivibrators and further including a control pre-stage which receives a single pulse train and generates therefrom two phase-shifted, i.e., antivalent pulse trains. The invention further provides a pulse divider circuit capable of a dividing ratio of 1:2 and including two sequential coupling circuits connected and operating in the manner of bistable flip-flops and triggered by two separate input pulse trains. Ahead of the multivibrators are connected gates having two inputs, one of these gates receiving one of the input pulse trains while the other receives the output signals from the preceding multivibrator and the output of the second multivibrator being crossed back to the input of the gate circuit ahead of the first multivibrator.

A frequency divider circuit of this type which will be described in greater detail below is particularly immune to outside disturbances. The status assumed by the divider circuit does not change even if the input pulse is composed of a number of subsidiary pulses as long as the opposite input is at a logical 0 value.

A particular advantage of the invention is that the outputs of the 1:2 divider circuits are always antivalent, i.e., out of phase and alternately 1 or 0 so that these outputs may be used immediately for actuating the subsequent stage. The inputs and outputs of each of the divider circuits can be so formed as to be useable in any desired number in direct concatenation.

The two-wire input actuation provides an immunity against disturbances in spite of asynchronous operation. The relatively expensive generation of a common clock pulse train is thereby avoided as are the separate connections to each and every circuit which would be required when using a common clock pulse train.

An additional advantage of the invention is that uneven dividing ratios are possible with only very little additional effort.

The invention will be better understood as well as further objects and advantages thereof become more apparent from the ensuing detailed description of a number of preferred embodiments taken in conjunction with the drawing.

BRIEF DESCRIPTION OF THE DRAWING

FIG. 3 represents a second exemplary embodiment of a dividing circuit according to the invention in schematic form;

FIG. 5 is a family of timing diagrams illustrating the function of a frequency divider circuit according to FIG. 2 and a further dividing circuit of that type connected in series;

DESCRIPTION OF THE PREFERRED EMBODIMENTS

Figure 1:
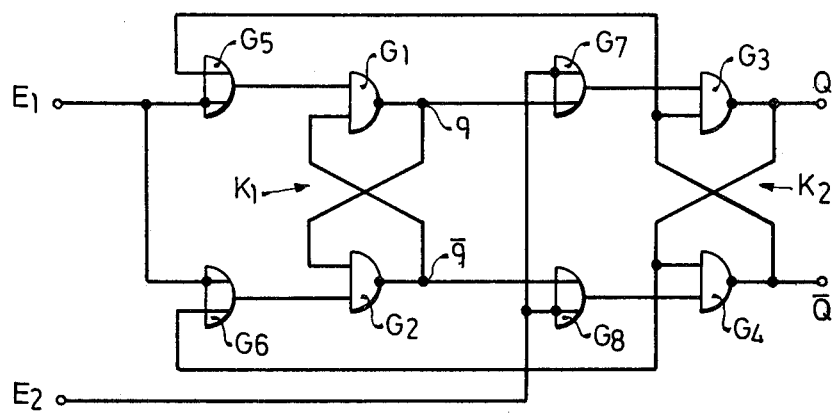
FIG. 1 is a schematic diagram of a first exemplary embodiment of a divider circuit according to the invention.

Turning now to FIG. 1, there will be seen a schematic diagram of a first exemplary embodiment of a frequency divider block which may be used for providing a dividing ratio of 1:2. As illustrated there, the dividing circuit includes two bistable flip-flops K1 and K2 formed by cross-coupled NAND gates G1, G2 and G3, G4, respectively. The two flip-flops K1 and K2 are connected in series and each of them is preceded by gate circuits. In particular, the output q of the NAND gate G1 is connected to one input of the NAND gate G2 and the output $\bar{q}$ of the NAND gate G2 is connected with an input of the NAND gate G1. The other inputs of the NAND gates G1 and G2 of the first flip-flop K1 are connected to the outputs of preceding OR gates G5 and G6, respectively. As illustrated by the dot at the input side, the OR gates G5 and G6 are such that the dotted input is a negating or inverting input. These negating inputs both receive a first input pulse train E1 while a second input pulse train E2 is conducted to the inverting inputs of two further OR gates G7 and G8 constructed in the same manner. The remaining inputs of the OR gates G7 and G8 are connected to the outputs of the NAND gates G1 and G2 belonging to the first flip-flop K1. The outputs of the OR gates G7 and G8 are used for triggering the NAND gates G3 and G4, respectively, belonging to the second flip-flop K2 which is connected in the same manner as the flip-flop K1, i.e., by a cross feedback of the outputs from the gates G3 and G4 to the remaining inputs. Finally, the remaining free inputs of the input OR gates G5 and G6 are cross-connected to the outputs Q and $\bar{Q}$, respectively of the second flip-flop K2. The outputs Q and $\bar{Q}$ also carry the output pulse trains Q and $\bar{Q}$ which are in the ratio of 1:2 with respect to the input pulse train.

The function of a divider circuit as described with the aid of FIG. 1 is as follows, under the assumption that the two input pulse trains E1 and E2 are complementary, i.e., are phase shifted by 180° and have the further special characteristic that, for example, the positive pulse of each of the pulse trains E1 and E2 is somewhat shorter than the corresponding negative pulse. In other words, the time during which the logical state 0 is obtained is somewhat shorter than the time during which the logical state 1 prevails. Expressed differently, and as will be discussed further with the aid of FIG. 5, the logical state 1 of each pulse train starts a little later than the onset of the logical state 0 of the respectively complementary pulse train and also ends somewhat ahead of the time of onset of the logical state 1 of the other pulse train. Thus, for a short period of time both of the input pulse trains simultaneously carry the logical signal 0. This manner of operation is desired to prevent the condition that both pulse trains are simultaneously in the state logical 1 which is not permitted for orderly operation.

In order to further clarify the operation of a divider circuit as in FIG. 1, let it be assumed that the initial condition is that the output $\overline{Q}$ of the NAND gate G4 is a logical 1 so that the output Q of the NAND gate G3 is a logical 0. Accordingly, the output q of the NAND gate G1 in the first flip-flop K1 is a logical 1 whereas the output $\overline{q}$ is a logical 0. As will be verified below, this set of assumptions is consistent.

It will be further assumed that, at the outset, the input pulse train E1 is positive, i.e., corresponds to the logical state 1. Accordingly, the pulse train E2 will be in the state logical 0 (compare the timing diagrams of curves 5b and 5c with those of 5d through 5g).

Inasmuch as Q=logical 0, the non-inverting or lower input of the gate G6 also carries a logical 0. The state logical 1 in the input pulse train E1 is inverted by the gate 6 to a logical 0 so that the output $\overline{q}$ of the NAND gate G2 goes to a logical 1, basically independently of the logical state of the other input. Therefore, the first flip-flop K1 or a similar flip-flop switches states because both of the inputs of the NAND gate G1 are a logical 1 and its output q is a logical 0. What is essential is that the output signal q=logical 0 blocks the entire flip-flop K1 because this same signal is also fed to the other input of the NAND gate G2 and the presence of a logical 0 at one of the inputs of an AND gate always holds its output in the state logical 1 independently of any changes taking place at the other input. Thus this status is maintained even if the signal E1 now returns to logical 0 or inadvertently fluctuates between the values logical 0 and logical 1. A change of this status only takes place if the logical state of the second input pulse train E2 causes the final part of the circuit consisting of the gates G3, G4 and G7, G8 to switch over so that the feedback to the gates G5 and G6 prepares them for a switch of polarity in the input pulse train E1. The condition logical 1 at the other input of the NAND gate G1 and deriving from the output of the OR gate G5 results because, even though the state logical 1 of the input pulse train E1 is inverted to a logical 0, the state $\overline{Q}$ equals logical 1 is fed back through the OR gate G5 to the other input of the NAND gate G1 in the flip-flop K1.

From what has been discussed so far, it is clear that the onset time of the circuit conditions is that corresponding to $t_0$ in FIG. 5, i.e., at a moment in which the input pulse train E1 goes to the state logical 1, resulting in a change of polarity of the outputs q and $\overline{q}$ in the first flip-flop K1. In the timing diagrams of FIG. 5, the subscripts 1 at the symbols q, $\overline{q}$ and Q, $\overline{Q}$ refer to a first divider circuit such as shown in FIG. 1 whereas the pulse trains of FIGS. 5h to 5l having the subscripts 2 relate to a second and subsequent dividing circuit block such as in FIG. 1 which is actuated by the first block.

Actually, all of the changes of state taking place in the portion of the dividing circuit of FIG. 1 which are connected with the multivibrator K1 do not influence the status of the second portion connected with the flip-flop K2 because, as previously agreed, the input pulse train E2 is at logical 0 which, due to the inversion, becomes a logical 1 at the outputs of the OR gates G7 and G8 and this state is not changed even if the multivibrator K1 flips over and causes a polarity shift at the other inputs of the OR gates.

At the time $t_1$ in FIG. 5, the instantaneous value of the pulse train E1 is a logical 0 so that nothing is changed in the stable state of the total system. At the point $t_2 = t_1 + \Delta t$ the pulse train E2 assumes a logical 1 and, after inversion by the OR gate G7, the output of the OR gate G7 assumes a logical 0 so that the NAND gate G3 is actuated and causes its output Q to change to a logical 1 from its previous value 0. The cross-over feedback then results in the immediate locking of the circuit. Hence, there has been an overall change of polarity of the output pulses Q and $\overline{Q}$ which immediately provide the new control pulse trains $E_{12}$ and $E_{22}$ as illustrated in the curves 5f and 5g.

At the same time, due to the feedback of these output signals to the non-inverting inputs of the OR gates G5 and G6, the states of the latter change such that an alteration of the logical state of the input pulse train E1 can cause a renewed switchover of the flip-flop K1. The subsequent operation can be seen directly from the pulse timing diagrams of FIG. 5.

Figure 2:
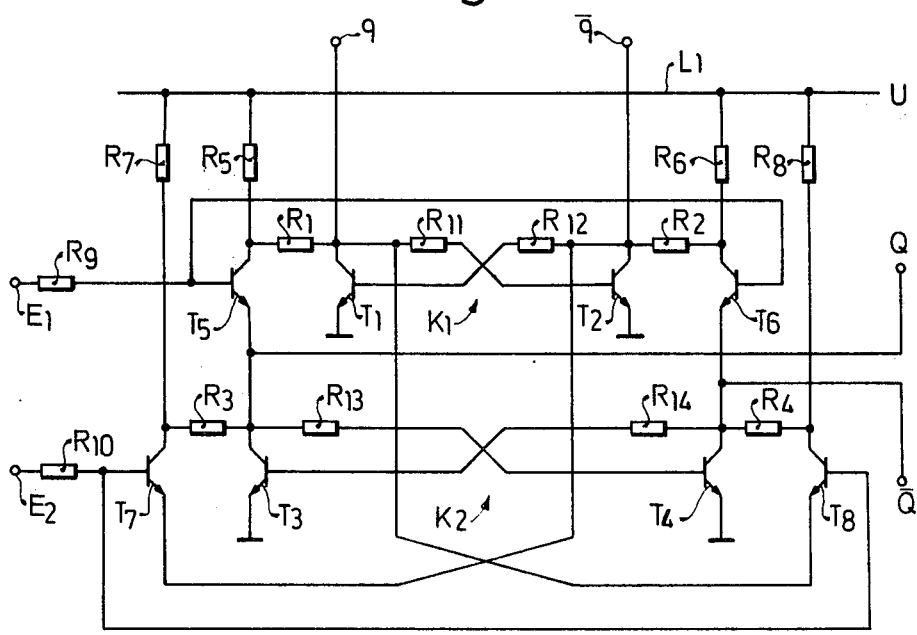
FIG. 2 is a detailed circuit diagram of the schematic circuit shown in FIG. 1 and illustrating the use of discrete circuit elements.

The detailed construction including discrete electronic elements of a frequency divider circuit such as illustrated in principle in FIG. 1 is shown in FIG. 2. A circuit such as described and illustrated in FIG. 2 is particularly well suited for being produced as an integrated circuit.

The two multivibrators K1 and K2 are seen to be formed by pairs of transistors T1, T2 and T3, T4, respectively. In each case, the collector of the one transistor is connected to the base of the other transistor via resistors R11, R12 and R13, R14. The emitters of the transistors T1 to T4 are connected directly to ground or to the negative supply line, whereas the collectors of the transistors T1 and T2 are connected in series with a resistor R5 and R6, respectively, to the positive supply line $L_1$. The collectors are further connected through resistors R1 and R2, respectively, to the outputs q and $\overline{q}$ respectively. In similar manner, the collector of the transistor T3 forms the output Q while the collector of the transistor T4 forms the output $\overline{Q}$. The inputs of these multivibrators K1 and K2 are controlled by associated transistors T5 to T8 so connected as to form the OR gates G5 to G8. For example, the gate G5 is represented by the transistor T5 and the inverting input is formed by the base of the transistor T5 which receives the input pulse train E1 via the resistor R9 whereas the non-inverting input of the gate G5 is formed by the emitter of the transistor T5.

In the further discussion is will be assumed that the transistor T2 of the flip-flop K1 receives base current from the positive line via the series-connected resistors R5, R1 and R11 so as to conduct and provide an output signal $\bar{q}$=logical 0, thereby holding the transistor T1 blocked via the resistor R12 to produce an output signal q=logical 1. When the transistor T5 receives a signal E1=logical 1, it becomes conducting and blocks the transistor T2 via resistors R1, R11 thereby causing a switchover. This is possible because the emitter of the transistor T5 is connected to the collector of the transistor T3, i.e., it is connected to receive the Q signal of the second flip-flop K2 which initially assumes the value 0 as already discussed with respect to FIG. 1. Accordingly, the transistor T3 is conducting and the junction of the resistors R5 and R1 lies above ground or the negative potential merely by the sum of two saturation voltages. The transistor T3 is conducting because, as already agreed, the entire process is assumed to start at a time when these conditions prevail; the base current for the transistor T3 flows through the resistors R14, R4 and R8. The transistor T8 whose emitter is connected to the output q (corresponding to the collector of the transistor T1) thus corresponds to the gate G7 of FIG. 1 and is blocked due to the pulse train E2 having the value 0. As already mentioned, the transistor T2 is blocked because of the fact that the pulse E1 is positive so that $\bar{q}$ is a logical 1. Hence the transistor T1 conducts because it receives base current through the resistors R6, R2 and R12. Even if the transistor T5 were to be blocked again at this point, the current flowing through the resistors R5 and R1 is conducted to ground by the transistor T1. Therefore, even if the switching state of the transistor T5 changes or if the input voltage E1 changes due to disturbances, etc., the current flowing through the resistors R5 and R1 is transmitted by the transistor T1 to ground. Accordingly, the input flip-flop formed by the transistors T1 and T2 is securely blocked as already explained with regard to the illustration of FIG. 1. The subsequent switching states which result from the change of polarities of the input pulse trains E1 and E2 will not be discussed and illustrated in detail but the person skilled in the art is capable of following the further sequence of events by inspection of the detailed circuit diagram of FIG. 2 and with the aid of the pulse timing diagrams of FIG. 5. However, certain basic principles which also apply to circuits yet to be described will not be mentioned. The input to the divider circuit of the present invention takes place via input contacts that are of equal status, i.e., the switching is performed by the input signals E1 and E2 and not by a so-called clock pulse train. This results in an increased reliability and immunity against disturbances for, as already explained above, the input voltage E1 or E2 which is positive at a given moment can undergo several subsidiary jitter pulses or voltage fluctuations without thereby interfering with the normal operation of the overall circuitry. An input which exhibits the state logical 0 is less likely to be subjected to voltage fluctuations and disturbances because such an input is of substantially lower impedance and less sensitive to disturbances. A further advantage of the two-wire input control is the availability of pairs of complementary outputs, i.e., q, $\bar{q}$ and Q, $\bar{Q}$ which are mutually phase shifted by 90° (see pulse timing diagrams 5d, 5e compared to FIGS. 5f, 5g) and this is especially true if, for example, the positive edges of E1 and E2 arrive at equal intervals.

A particular significance of the exemplary embodiment depicted in FIG. 1 is that it is a circuit which is easily embodied as an integrated circuit in which the resistors R1, R2, R3 and R4, especially, can be embodied as so-called epitaxial resistors, i.e., the transistor pairs T1, T5 and T2, T6, etc., can be disposed in a common trough, i.e., one part of a flip-flop and the associated input gate are located on a common island. In this connection, it is also significant that the base current, for example for the transistor T2, flows over the collector of the transistor T5 and the epitaxial resistor so that this voltage at the base of the transistor T2 (or at the other appropriate flip-flop transistor in the circuit) can be kept very small. This also results in a high actuation reliability and a reliable latching of the circuit because, in all other cases, for example if the supply voltage U were to engage a collector resistor of the transistor T1, the resulting voltage division would not have as precise an influence on the control voltage at the base of the flip-flop transistors. Thus, the internal resistances of the transistors can be eliminated even at the level of the chip layout.

Figure 6:
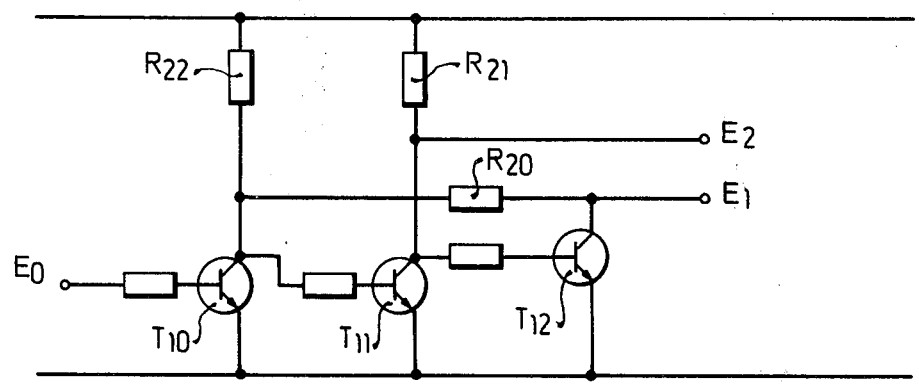
FIG. 6 is a circuit diagram of an exemplary embodiment of an input circuit for generating two phase-shifted input pulse trains.

It has already been mentioned that one of the necessary conditions for actuating the frequency divider circuit of the present invention is that the two input pulse trains not both be in the state of a logical 1 and this condition is insured by an input circuit which is shown in detail in FIG. 6 and will now be described. In the exemplary embodiment of an input circuit as illustrated in FIG. 6, a common control transistor T10 receives one input pulse train $E_0$ which may, for example, be synchronous with crankshaft rotation. As suggested by FIG. 5a, this pulse train may be derived from the ignition pulses, possibly after processing by a pulse shaping circuit formed by other multivibrators which are not further shown or illustrated.

The collector of the transistor T10 may be regarded as the element which produces the previously referred-to pulse trains E1 and E2, in particular the pulse train E1 is produced at the other end of a resistor R20. In that case, the signal E2 is produced at the collector of a transistor T11 connected behind the transistor T10 and thus is inverted with respect to the signal E1. If it is assumed that, at a particular time, the transistor T10 is blocked by the control pulse $E_0$, the collector of the transistor T10 will be a high potential and the instantaneous value of the pulse train E1 will be a logical 1. The corresponding state of the pulse train E2 taken from the collector of the transistor T11 via the resistor R21 will be a logical 0. When a switchover occurs, i.e., when the transistor T10 becomes conducting, its collector potential goes to ground and E1 assumes the state logical 0. The subsequent transistor T11 however requires a certain short period of time to assume its new state so that the pulse train E2 assumes the state logical 1 after a very short but finite amount of time. This delay insures that the two outputs do not simultaneously carry the state logical 1.

When the next switchover occurs, the transistor T10 blocks again and the circuit attempts to cause the pulse train E1 to become a logical 1. However, this is prevented because a further transistor T12 controlled by the transistor T11 still conducts and maintains the logical state 0 of the control pulse train E1 until the transistor T11 is definitely conducting and the input pulse train E2 has switched over to the state logical 0. Only then, after the collector of the transistor T11 goes low, does the transistor T12 block and release the logical state 1 for the pulse train E1. These events results in the phase relationships for the pulse trains E1 and E2 as illustrated in FIGS. 5b and 5c, respectively.

A second exemplary embodiment of a frequency divider circuit according to the present invention is illustrated as a schematic diagram in FIG. 3 similar to the manner of illustration of FIG. 1, i.e., in a system of mutually coupled gate circuits. The exemplary embodiment of FIG. 3 employs only NOR gates and the reference symbols previously used for FIG. 1 have been retained with the addition of a prime. The basic construction and function are similar to that previously discussed with respect to the embodiment of FIG. 1 although in the present case the condition is assumed that the input pulse trains $E_1'$ and $E_2'$ do not both simultaneously exhibit the state logical 0. A complete cycle of the two input pulse trains is represented by the five switching states given adjacent to the outputs of each of the gates of FIG. 3. These switching states which may be labeled "a" through "e" are further referred to in the table below and correspond to the logical states prevailing at the outputs of the individual gates. The various entries in the vertical columns are to be read together at this same position. The consistency of the illustrated states can be verified with the consideration that a NOR gate has a 0 output if at least one of its inputs is a logical 1 whereas it exhibits a logical 1 at its output when both inputs are 0. If the topmost state is "a" while the lowermost state is "e", the following table gives the conditions of the input pulse train $E_1'$ and $E_2'$ for the various circuit states "a" through "e".

Figure 4:
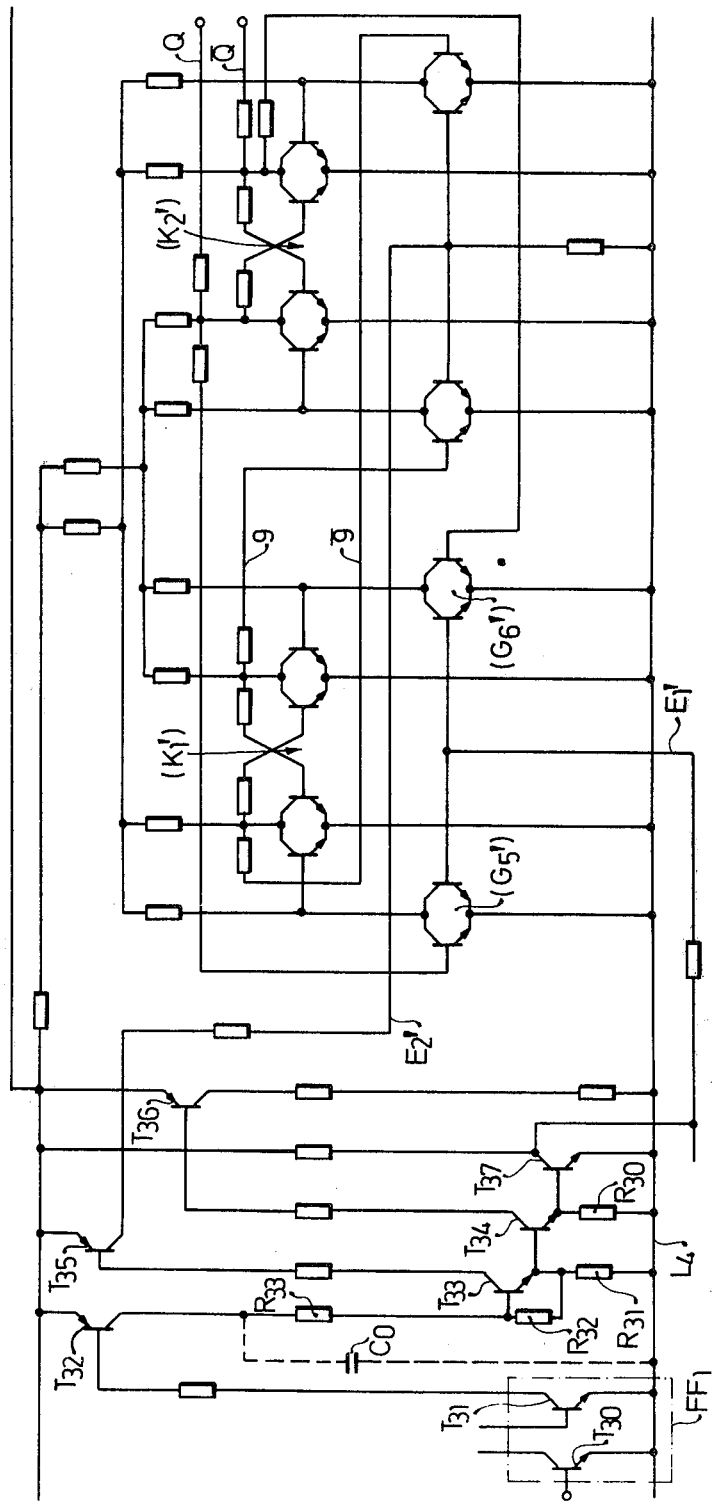
FIG. 4 is the detailed embodiment of the circuit shown schematically in FIG. 3.

(a) represents $E_1'=0$; $E_2'=1$
(b) represents $E_1'=1$; $E_2'=1$
(c) represents $E_1'=1$; $E_2'=0$
(d) represents $E_1'=1$; $E_2'=1$
(e) represents $E_1'=0$; $E_2'=1$ A detailed exemplary circuit including transistors and resistors and thus easily capable of large-scale integration and including an input circuit is illustrated in FIG. 4. This illustration shows that the construction from individual circuit elements is somewhat more elaborate because each of the NOR gates consists of two individual transistors, the emitters and collectors of which are joined. The equivalents of the individual transistor pairs with the gates of FIG. 3 may be found easily by referring to the pulse trains $E_1'$ and $E_2'$ and the outputs $q,\overline{q}$ and $Q,\overline{Q}$.

The input portion of the circuit of FIG. 4 includes two transistors T30, T31 which together form a monostable flip-flop which will not be further discussed. If the transistor T30, for example, is controlled by the ignition pulses, it becomes conducting, thereby blocking the transistor T31. A subsequent transistor T32 is also caused to block. The collector of the transistor T32 is connected to ground via a capacitor $C_0$ which however may be represented by the inherent capacitance so as not to be required discretely. For this reason, the connection to this capacitor is shown only in dashed lines. When the transistor T32 blocks, the collector potential falls to the voltage of the line L4, for example 0 volt. The subsequent transistors T33 through T36 react to this change of potential at various times. This is due to the following considerations. The base-to-ground resistors of the transistors T33, T34 and T37 are of different size so that each transistor conducts when its base experiences at least the base emitter voltage which is present across the respective resistor, i.e., R30 for the base of the transistor T37, R31 for that of the transistor T34 and T32 for the base of the transistor T33. Thus, for example the value of the resistor R32 is so chosen that the transistor T33 is just conducting and can just cause conduction in the transistor T35 connected to its collector, whereas the subsequent transistor T34 connected in the emitter circuit of the transistor T33 has been blocked for some time because its positive potential could no longer be maintained due to the different and lower value of the resistor R31. The same applies in even greater degree to the transistor T37. Expressed in other words, only a relatively small current needs to flow through the resistor R33 in the collector circuit of the transistor T32 in order to keep the transistor T33 as well as the transistor T35 in conduction whereas the subsequent transistor chain T34, T37 is already blocked. Thus, if one regards an edge of the input pulse which has led to a blockage of the transistor T32 is will be seen that the transistor T35 still conducts and its collector resistor R35 still holds the input pulse train $E_2'$ at positive potential (logical 1) whereas, due to the circumstances described above, the transistor T37 has already blocked and its collector is at positive potential (the input pulse train $E_1'$ is also at a logical 1). This relates to the time period "b" in the representation of FIG. 3, i.e., the second of the vertical column entries, in which the control pulse train $E_1'$ is the first to become positive and, after the transistor T33 is finally blocked, the transistor T35 also blocks and the pulse train $E_2'$ goes to 0 potential, i.e., a logical 0. The circuit then assumes the state "c" of FIG. 3. The opposite process takes place when the flip-flop $FF_1$ formed by the transistors T30 and T31 returns to its original state resulting in the conditions "d" and "e" of FIG. 3 which will not be further discussed. The remaining parts of the circuit of FIG. 4 which consist of pairs of transistors and the function of which is the same as that of FIG. 3 will not be further discussed although some of the transistor pairs in FIG. 4 are provided with numbers in parenthesis which relate to the equivalent portions of the circuit of FIG. 3 so as to facilitate identification.

A circuit which is capable of providing an uneven division ratio will now be discussed with the aid of the illustration of FIG. 7. This circuit principally represents the transition between a first frequency divider block and a second frequency divider block. In the illustration, the first of these blocks corresponds to the right half of the circuit of FIG. 2 (illustrated by transistors T6, T4 and T8) and whose overall designation is B1 whereas the subsequent frequency divider block carries the overall designation B2 and corresponds to the input portion of the circuit illustrated in FIG. 2. If the blocks B1 and B2 were connected directly behind one another without the intermediate circuit to be further discussed, and illustrated in FIG. 7, the overall frequency dividing ratio would be 1:4 and, in the normal case, the output of the second divider block B2 would show the pulse trains illustrated in FIGS. 5h to 5l.

Figure 7:
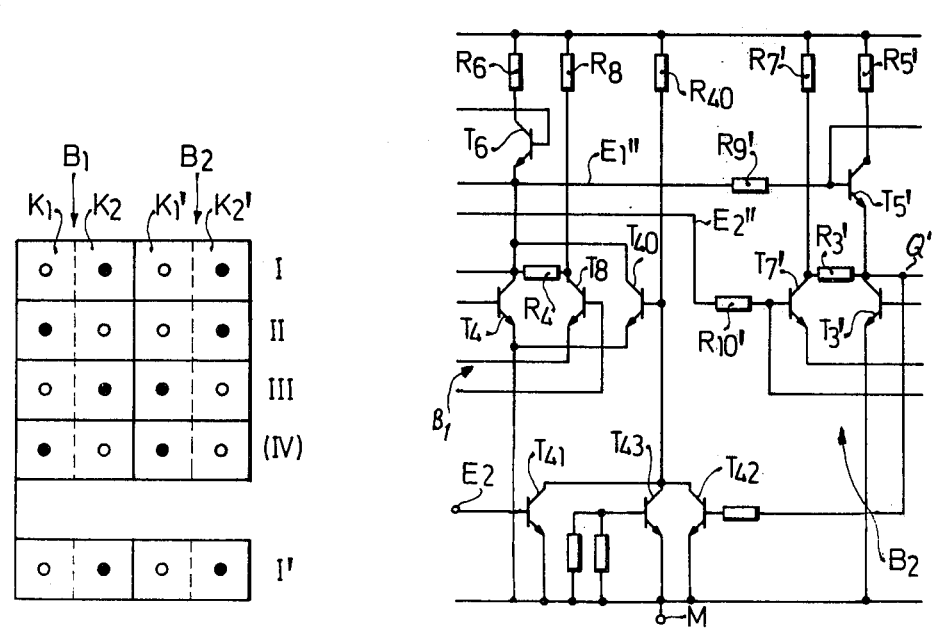
FIG. 7 is a circuit diagram of an additional circuit for providing uneven dividing ratios including portions of the dividing circuit which precede and follow it.

In order to achieve a dividing ratio of 1:3, the circuit illustrated in FIG. 7 suppresses one of the four possible states jointly produced by the blocks B1 and B2. Thus, in order to obtain a dividing ratio of 1:3, the overall circuit requires two blocks normally capable of an overall ratio of 1:4. The additional circuitry required for obtaining a 1:3 division includes a transistor T40 which is connected in parallel with the transistor T4 belonging to the second flip-flop K2 of the first divider block B1. If suitably actuated, this transistor T4 can be brought into a conducting state so that it provides a current path simulating a conducting transistor T4 even though that transistor is actually blocked. In that case, the circuit will skip one of the bistable positions.

In order to create these conditions, the supplementary circuit illustrated in FIG. 7 combines the input signal E2 of the first frequency divider block B1 with the output signal Q' of the second frequency divider block B2 in the sense of a NOR circuit formed by the transistors T41 and T42. This means that, whenever both the pulse E2 as well as the output pulse Q' exhibit a logical 0 the transistors T41 and T42 block and their common output connection (i.e., the joined collectors connected to the plus line via the resistor R40) are at high potential, i.e., exhibit the state logical 1. In that case and under these conditions the transistor T40 will conduct because it receives base current through the resistor R40, and the state related to a blockage of the transistor T4 is suppressed at this time.

In order to further illustrate these conditions there is provided the table of FIG. 7 which gives information regarding the status of the flip-flops within the divider blocks B1 and B2. A conducting or first state of each flip-flop $K_i$ is indicated by a black dot whereas the blocked state or second flip-flop state is indicated by an open circle. The first four rows indicate the normal switching states resulting in an overall dividing ratio of 1:4. The electronic circuit just described is intended to suppress the state IV and this is accomplished by suppressing the open circle of the flip-flop K2 by means of the conducting transistor T4 which thereby simulates a dot in that position resulting in the last row I' which is seen to be identical to the first row I. In other words, this implies that, after three switching states, the circuit of FIG. 7 returns to its initial condition, thereby providing a division in the ratio 1:3.

A further transistor T43 connected in parallel with the transistors T41 and T42 may be actuated if it is desired to suppress the 1:3 division. The coupling circuit consisting of the transistors T41, T42 and T43 is seen to represent a NOR gate having three control inputs.

The foregoing relates to merely preferred exemplary embodiments of the invention, it being understood that other embodiments and variants thereof are possible within the spirit and scope of the invention.

What is claimed and desired to be secured by Letters Patent of the United States is:

1. A frequency divider circuit for producing a train of output pulses whose frequency is lower than the frequency of a primary input pulse train, comprising:
   first circuit means for receiving said primary pulse train and for generating therefrom first and second periodic input pulse trains (E1,E2) of opposite phase;
   a first bistable multivibrator consisting of first and second logical gates, having at least two inputs, the output of said first gate being connected to a first input of said second gate and the output of said second gate being connected to a first input of said first gate;
   a second bistable multivibrator, consisting of third and fourth logical gates, having at least two inputs, the outputs of said third gate being connected to a first input of said fourth gate and the output of said fourth gate being connected to a first input of said third gate;
   a fifth gate having at least two inputs, a first input thereof being connected to receive a first one of said pulse trains (E1,E2) and a second input thereof being connected to the output of said fourth gate, the output of said fifth gate being connected to a second input of said first gate;
   a sixth gate having at least two inputs, a first input thereof being connected to receive said first one of said pulse trains (E1,E2) and a second input thereof being connected to the output of said third gate, the output of said sixth gate being connected to a second input of said second gate;
   a seventh gate having at least two inputs, a first input thereof being connected to receive the second one of said pulse trains (E1,E2) and a second input thereof being connected to the output of said first gate, the output of said seventh gate being connected to a second input of said third gate; and
   an eighth gate having at least two inputs, a first input thereof being connected to receive the second one of said pulse trains (E1,E2) and a second input thereof being connected to the output of said second gate, the output of said eighth gate being connected to a second input of said fourth gate.

2. A frequency divider circuit as defined by claim 1, wherein the gates in said first and second pair of logical gates are NAND gates (G1, G2, G3, G4) and where for each pair of NAND gates the output of one of the gates is fed back to the input of the respective other gate and wherein said 2-input logical gates are NOR gates one of whose inputs is an inverting input and is the input receiving said first and second periodic input pulse trains (E1, E2).

3. A frequency divider circuit as defined by claim 1, wherein the gates of said first and second pair of logical gates are NOR gates the outputs of which are cross-connected back to their respective inputs and wherein the two-input logical gates receiving said first and second periodic input pulse trains (E1, E2) are NOR gates.

4. A frequency divider circuit as defined by claim 1, wherein each of said first and second bistable multivibrators consists of pairs of transistors having respective collectors cross-connected to respective bases and further includes a pair of input transistors the bases of which receive respectively said first and second periodic input pulse trains (E1, E2) and wherein the emitters of said input transistors are connected to the collectors of said transistors in said bistable multivibrator.

5. A frequency divider circuit as defined by claim 4, wherein one of the transistors (T5, T6, T7, T8) which form said 2-input logical gates (G5, G6) is symmetrically connected with one of the transistors (T1, T2, T3, T4) forming said first and second bistable multivibrators, respective collectors being connected via a resistor (R1, R2, R3, R4) and wherein the collector of each transistor (T5, T6, T7, T8) is connected via a respective resistor (R5, R6, R7, R8) to the positive supply voltage of the circuit and wherein, when the logical state of said first and second periodic input pulse train (E1, E2) changes, the status change of said transistors (T5, T6, T7, T8) is conducted through a respective collector resistor (R5, R6, R7, R8) and the associated collector and the intermediate resistor (R1, R2, R3, R4) to the collector of one of the transistors (T1, T2,, T3, T4) of the respective bistable multivibrator and acts via a respective feedback resistor (R11, R12, R13, R14) on the switching state of the respective other transistor in said first and second bistable multivibrator.

6. A frequency divider circuit as defined by claim 4, wherein said first circuit means for receiving said primary pulse train and for generating therefrom first and second periodic input pulse trains (E1, E2) includes a first transistor (T10) receiving said primary pulse train connected to a further transistor (T11) and wherein the collectors of the transistor (T10) and the transistor (T11) are connected via respective resistors (R21, R22) with the supply voltage of the circuit and wherein said first and second periodic input pulse trains (E1, E2) are taken from respective ones of said collectors of said transistors (T10, T11) and further including a resistor (R20) connected to the collector of said first transistor (T10) connected to the collector of a further transistor (T12) the base of which is connected to the collector of said second transistor (T11); whereby said first and second periodic input pulse trains (E1, E2) never simultaneously exhibit the positive logical state 1.

7. A frequency divider circuit as defined by claim 1, wherein said first and second bistable multivibrators consist of pairs of NOR gates the outputs of which are cross-connected back to their respective inputs and wherein said 2-input logical gates are NOR gates, said NOR gates being formed by pairs of transistors respective collectors and emitters of which are joined and respective bases of which form the 2-inputs of each of said NOR gates.

8. A frequency divider circuit as defined by claim 7, wherein said first circuit means for generating said first and second periodic input pulse trains (E1, E2) includes a number of sequentially connected emitter-coupled transistors (T33, T34, T37) each having a respective base drain resistor (R30, R31, R32) connected to ground, the dimensions of which are such that when an input control voltage changes, the state of said number of transistors changes at different times.

9. A frequency divider circuit as defined by claim 8, further comprising a flip-flop (FF₁) for receiving said primary pulse train and generating therefrom a square pulse train and further comprising a first transistor (T32) which receives said square pulse train and so alters the collector potential of said transistor (T32) that said transistor (T33) of said number of transistors (T33, T34, T37) retains its original switching state for the longest time.

10. A frequency divider circuit as defined by claim 8, including a further transistor (T35) the base of which is connected to the collector of said transistor (T33) and this collector generates said periodic pulse train (E2) while the last transistor of said number of transistors (T33, T34, T37) generates said second periodic pulse train (E2); whereby the first and second pulse trains (E1, E2) never simultaneously exhibit the logical state 0.

11. A frequency divider circuit as defined by claim 1, further comprising a supplementary circuit including transistors (T40, T41, T42) so coupled with the second bistable multivibrator as to suppress one of the normal switching states thereof.

12. A frequency divider circuit as defined by claim 11, wherein said supplementary circuit includes a NOR gate one of whose inputs receives said periodic pulse train (E2) and the other of whose inputs receives one of the output signals from one of the bistable multivibrators and further includes a transistor (T40) which is controlled by said NOR gate.

13. A frequency divider circuit as defined by claim 12, wherein the emitter-collector path of said supplementary transistor (T40) is connected in parallel with the emitter-collector path of one transistor (T4) in said second bistable multivibrator.

14. A frequency divider circuit as defined by claim 13, further comprising a transistor (T43) for suppressing the output of said supplementary circuit composed of said NOR gate and said transistors (T41, T42) by application of a suitable external control voltage at an input M.

* * * * *